United States Patent
Lee et al.

(10) Patent No.: US 9,735,135 B2
(45) Date of Patent: Aug. 15, 2017

(54) OPTICAL SENSOR PACKAGE AND OPTICAL SENSOR ASSEMBLY

(71) Applicant: PIXART IMAGING (PENANG) SDN. BHD., Penang (MY)

(72) Inventors: Hun-Kwang Lee, Penang (MY); Sai-Mun Lee, Penang (MY); Yik-Leong Chong, Penang (MY)

(73) Assignee: PIXART IMAGING (PENANG) SDN. BHD., Penang (MY)

( * ) Notice: Subject to any disclaimer, the term of this patent is extended or adjusted under 35 U.S.C. 154(b) by 0 days.

(21) Appl. No.: 14/560,192

(22) Filed: Dec. 4, 2014

(65) Prior Publication Data
US 2016/0163681 A1 Jun. 9, 2016

(51) Int. Cl.
| | |
|---|---|
| H01L 25/16 | (2006.01) |
| H01L 31/12 | (2006.01) |
| H01L 31/02 | (2006.01) |
| H01L 31/0232 | (2014.01) |
| H01L 27/146 | (2006.01) |

(52) U.S. Cl.
CPC .......... *H01L 25/167* (2013.01); *H01L 25/165* (2013.01); *H01L 27/14618* (2013.01); *H01L 27/14625* (2013.01); *H01L 31/02002* (2013.01); *H01L 31/02327* (2013.01); *H01L 31/12* (2013.01); *H01L 2924/0002* (2013.01)

(58) Field of Classification Search
None
See application file for complete search history.

(56) References Cited

U.S. PATENT DOCUMENTS

| | | | | |
|---|---|---|---|---|
| 6,342,406 B1 * | 1/2002 | Glenn | ............... | H01L 27/14618 438/116 |
| 7,768,574 B2 * | 8/2010 | Humpston | ............... | G02B 7/02 348/340 |
| 7,939,361 B2 * | 5/2011 | Honda | ............... | H01L 27/14618 257/432 |
| 7,964,926 B2 * | 6/2011 | Kim | ............... | H01L 27/14627 257/431 |
| 8,138,027 B2 * | 3/2012 | Camacho | ............... | H01L 21/563 257/E21.502 |
| 8,866,248 B2 * | 10/2014 | Camacho | ............... | H01L 21/6835 257/434 |
| 8,928,104 B2 * | 1/2015 | Tu | ............... | H01L 27/14618 257/433 |
| 2007/0090478 A1 * | 4/2007 | Chen | ............... | H01L 27/14618 257/433 |
| 2008/0237766 A1 * | 10/2008 | Kim | ............... | H01L 27/14627 257/432 |
| 2011/0049662 A1 * | 3/2011 | Camacho | ............... | H01L 21/6835 257/434 |

(Continued)

FOREIGN PATENT DOCUMENTS

TW 2008-14758 9/2006

*Primary Examiner* — Abul Kalam
(74) *Attorney, Agent, or Firm* — Hauptman Ham, LLP

(57) ABSTRACT

There is provided an optical sensor package including a semiconductor base layer. A first surface of the semiconductor base layer is formed with a pixel array, a plurality of solder balls and an optical component such that when the optical sensor package is assembled with a substrate, the optical component is accommodated in an accommodation throughhole of the substrate so as to reduce the total thickness.

7 Claims, 6 Drawing Sheets

(56) References Cited

U.S. PATENT DOCUMENTS

| | | | |
|---|---|---|---|
| 2011/0156188 A1* | 6/2011 | Tu | H01L 27/14618 257/432 |
| 2011/0260275 A1* | 10/2011 | Cho | H01L 23/3171 257/432 |
| 2014/0183591 A1* | 7/2014 | Jow | H01L 27/14618 257/99 |

* cited by examiner

OPTICAL SENSOR PACKAGE AND OPTICAL SENSOR ASSEMBLY

BACKGROUND

1. Field of the Disclosure

This disclosure generally relates to an optical sensor package and an optical sensor assembly and, more particularly, to an optical sensor package and an optical sensor assembly manufactured by wafer level processing.

2. Description of the Related Art

The image sensor package manufactured by wafer level processing generally includes a lens disposed upon a sensing surface to be served as a protection layer and a plurality of solder balls for transmitting signals to and from an external component. However, in the conventional image sensor package, the solder balls and the lens are respectively disposed at two opposite sides of an image sensor chip such that the package has a considerable thickness and complicated manufacturing process.

SUMMARY

Accordingly, the present disclosure provides an optical sensor assembly having a thin thickness.

The present disclosure provides an optical sensor package having a simple manufacturing process.

The present disclosure provides an optical sensor assembly having a small interference from stray light.

The present disclosure provides an optical sensor package including a base layer, a plurality of solder balls and an optical component. The base layer includes a pixel array disposed close to a first surface of the base layer. The solder balls are disposed on the first surface of the base layer and outside of the pixel array. The optical component covers on the pixel array and includes a transparent layer, a filter layer and an opaque layer. The transparent layer is attached to the first surface of the base layer and covers on the pixel array. The filter layer covers on the transparent layer. The opaque layer covers the transparent layer and the filter layer and exposes a part of the filter layer configured as a transparent aperture.

The present disclosure further provides an optical sensor assembly including an optical sensor package and a substrate. The optical sensor package includes a base layer and an optical component. A first surface of the base layer is formed with a pixel array and a plurality of solder balls. The optical component is attached to the first surface of the base layer and covers on the pixel array, and has a transparent aperture opposite to the pixel array. The substrate includes a first surface, a second surface, an accommodation throughhole and a plurality of contact pads. The accommodation throughhole accommodates the optical component of the optical sensor package. The contact pads are formed on the first surface of the substrate and electrically connected to the solder balls of the optical sensor package.

The present disclosure provides an optical sensor package including a base layer, a pixel array, a plurality of solder balls and an optical component. The base layer has a first surface. The pixel array is disposed on the first surface. The plurality of solder balls is disposed on the first surface and outside of the pixel array. The optical component covers on the pixel array.

The optical sensor package of the present disclosure is preferably manufactured in the wafer level process. The manufactured optical sensor package is adapted to be combined with a substrate with an accommodation throughhole so as to accomplish the optical sensor assembly of the embodiment of the present disclosure. Compared with the conventional package structure, the provided structure has a thin thickness and a simple manufacturing process.

BRIEF DESCRIPTION OF THE DRAWINGS

Other objects, advantages, and novel features of the present disclosure will become more apparent from the following detailed description when taken in conjunction with the accompanying drawings.

DETAILED DESCRIPTION OF THE EMBODIMENT

It should be noted that, wherever possible, the same reference numbers will be used throughout the drawings to refer to the same or like parts.

Figure 1:
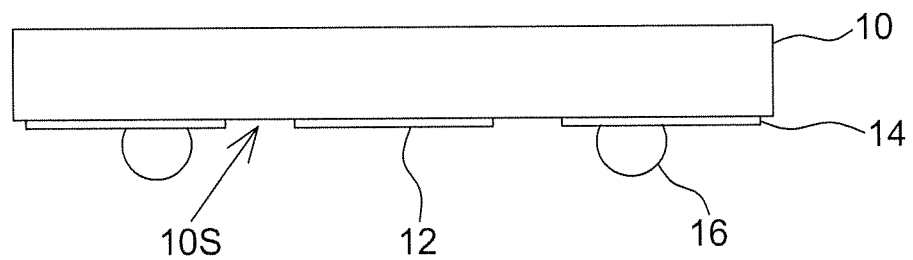
FIG. 1 is a partial cross-sectional view of an optical sensor package according to one embodiment of the present disclosure.
Figure 2:
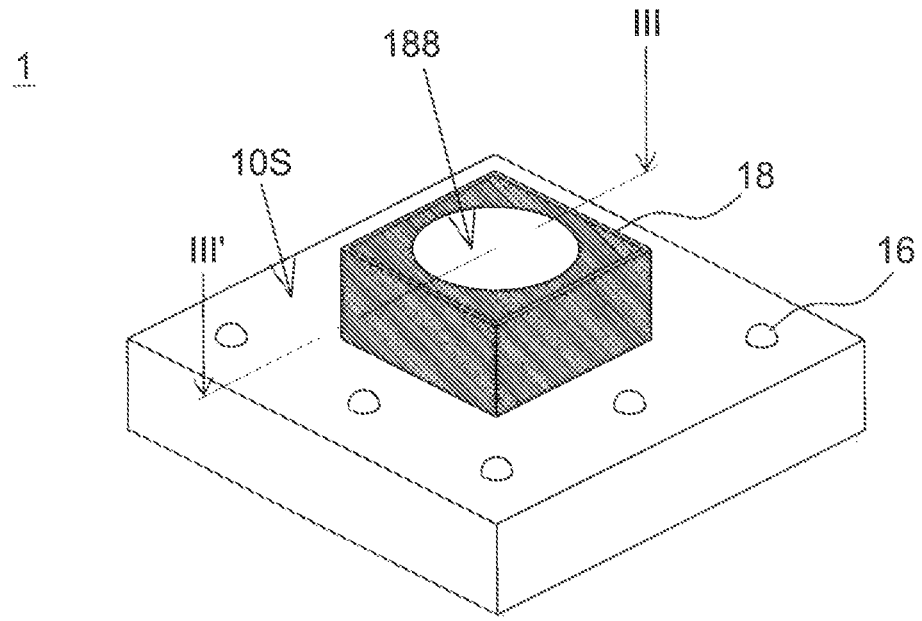
FIG. 2 is a solid diagram of an optical sensor package according to one embodiment of the present disclosure.

Referring to FIGS. 1 and 2. FIG. 1 is a partial cross-sectional view of an optical sensor package according to one embodiment of the present disclosure, and FIG. 2 is a solid diagram of an optical sensor package according to one embodiment of the present disclosure. The optical sensor package 1 of this embodiment includes a base layer 10, a pixel array 12, a plurality of bond pads 14, a plurality of solder balls 16 and an optical component 18, wherein the optical sensor package 1 is a wafer level package structure.

The base layer 10 is a semiconductor base layer which has a first surface (e.g. the bottom surface shown in FIG. 1) 10S configured to receive incident light. The pixel array 12 is formed inside the base layer 10 and close to a side of the first surface 10S, and the pixel array 12 occupies a part of the first surface 10S, e.g. the central area, but not limited thereto. For example, the pixel array 12 includes a plurality of photodiodes arranged in a matrix and configured to convert incident light energy to electrical signals. According to different applications, a plurality of microlens and/or a plurality of filter layers are further formed on the pixel array 12, wherein each of the microlens may correspond to at least one photodiode configured to adjust the angle of incident light thereby improving the light sensing efficiency; and each of the filter layers may correspond to at least one photodiode configured to block light outside of a target light spectrum, wherein said target light spectrum is referred to the light spectrum to be detected by the pixel array 12. The method of forming a pixel array 12 in a base layer is well known and thus details thereof are not described herein.

In addition, according to different applications, a control circuit (not shown) may further be formed inside the base layer 10 and electrically coupled to the pixel array 12 configured to control the charge acquisition, reset and charge transferring of the pixel array 12. More specifically, the control circuit may include a plurality of transistors configured to control the charge acquisition, reset and charge transferring of the photodiodes of the pixel array 12. In some embodiments, the control circuit may directly perform the post-processing of image signals and output digital signals according to different applications.

The bond pads 14 are formed by patterning conductive material (e.g. metal) and electrically coupled to the conductive line(s) inside the base layer 10. The bond pads 14 are configured as a bonding interface between the first surface 10S of the base layer 10 and the solder balls 16.

The solder balls 16 are disposed on the first surface 10S of the base layer 10 and located outside of the pixel array 12. In one embodiment, the solder balls 16 may be combined with the bond pads 14 by welding process and configured as a signal transmission interface between the pixel array 12 (and the control circuit) and external components. Preferably, the solder balls 16 are disposed between the optical component 18 and edges of the first surface 10S. In some embodiment, the solder balls 16 may be replaced by solder bumps.

The optical component 18 is attached to the first surface 10S of the base layer 10 and covers on the pixel array 12 configured to protect the pixel array 12 and block stray light. For example, the optical component 18 may be adhered to the first surface 10S of the base layer 10 via glue or attached to the first surface 10S of the base layer 10 via other conventional ways. For example, the optical component 18 has a transparent aperture 188 opposite to the pixel array 12 such that the light to be detected may propagate to the pixel array 12 through the transparent aperture 188. Other surfaces of the optical component 18 are covered with an opaque material so as to block stray light from lateral directions.

Figure 3:
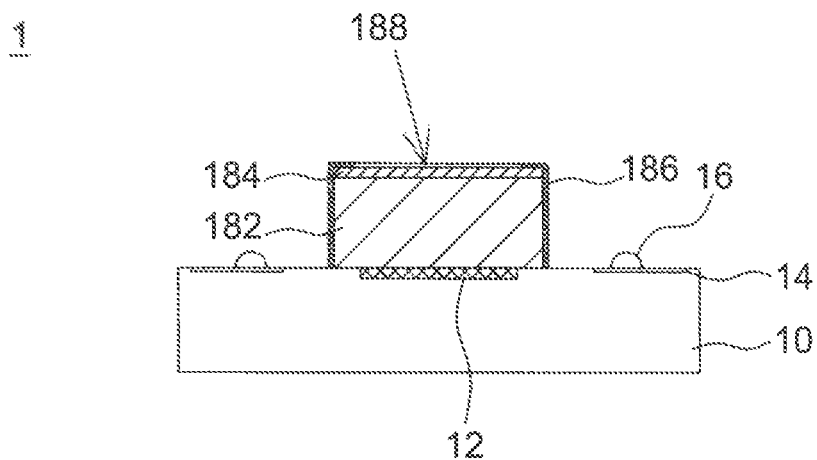
FIG. 3 is a cross-sectional view of the optical sensor package of FIG. 2.

Referring to FIG. 3, it is a cross-sectional view along line III-III' of the optical sensor package 1 of FIG. 2. The optical component 18 includes a transparent layer 182, a filter layer 184 and an opaque layer 186, wherein the opaque layer 186 is made of opaque material and has the transparent aperture 188 for the light penetration, wherein the transparent aperture 188 is preferably opposite to the pixel array 12.

The transparent layer 182 may be a glass layer or a plastic layer which is transparent to the target light spectrum. The transparent layer 182 is directly attached to the first surface 10S of the base layer 10 and covers on the pixel array 12, e.g. adhering to the first surface 10S via glue, wherein the glue is also transparent to the target light spectrum. Preferably, a sectional area of the transparent layer 182 is larger than or equal to that of the pixel array 12 so as to effectively protect the pixel array 12.

The filter layer 184 covers on the transparent layer 182, e.g. combined by adhering or directly coating thereon. In one embodiment, a sectional area of the filter layer 184 matches that of the transparent layer 182, but not limited thereto. According to different applications, the filter layer 184 may not be implemented. For example, when the pixel array 12 itself has the filter layers corresponding to the photodiodes, the filter layer 184 may not be implemented. The transmission spectrum of the filter layer 184 may be determined according to the target light spectrum, e.g. the filter layer 184 may be an infrared (IR) filter layer, but not limited thereto.

The opaque layer 186 covers on all sides of the transparent layer 182 and the rest of the filter layer 184 other than the transparent aperture 188 so as to block the incident light from lateral directions. More specifically, the opaque layer 186 covers on surfaces of the transparent layer 182 and the filter layer 184 and exposes a part of the filter layer 184 configured as the transparent aperture 188 for the light transmission.

Referring to FIGS. 4A-4F, they are schematic diagrams of manufacturing the optical component of an optical sensor package according to one embodiment of the present disclosure. The optical component 18 may be separately manufactured as a matrix of optical components 18 in the wafer level process, and the matrix of optical components 18 is then attached to the optical sensor chips before the singulation of a silicon wafer so as to form the optical sensor package 1 shown in FIGS. 2 and 3.

Figure 4A:
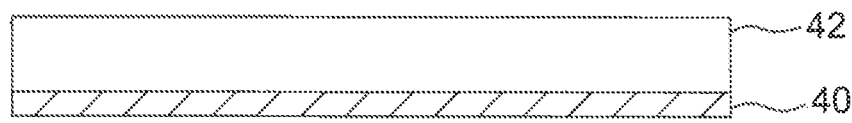
FIGS. 4A-4F are schematic diagrams of manufacturing the optical component of an optical sensor package according to one embodiment of the present disclosure.
Figure 4B:
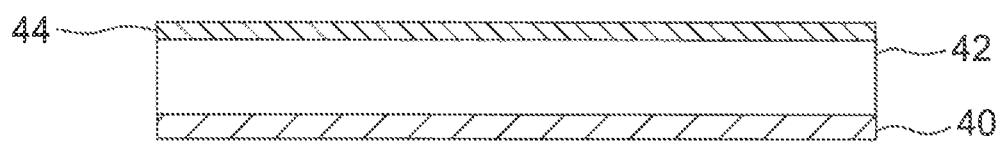
Figure 4C:
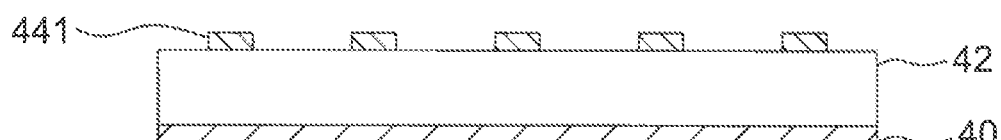
Figure 4D:
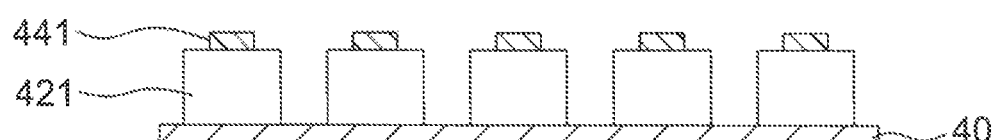
Figure 4E:
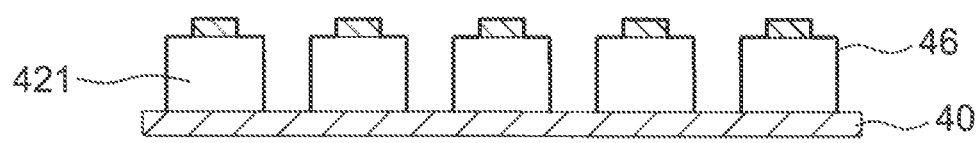
Figure 4F:

For example in FIG. 4A, a glass layer 42 (may or may not include a filter layer) is formed on a tape 40. Then in FIG. 4B, a photoresist layer 44 is formed on the glass layer 42. Then, the photoresist layer 44 is patterned by the photolithograph process to form a patterned photoresist layer 441 which is aligned with the transparent aperture 188 as shown in FIGS. 2-3 as shown in FIG. 4C. In FIG. 4D, the glass layer 42 is singulated (or cut) to a plurality of individual components 421, wherein each of the individual components 421 is aligned with the positions of the optical sensor chips on the silicon wafer to be combined. After the singulation, an opaque layer 46 is formed on each of the individual components 421 as shown in FIG. 4E to be served as the opaque layer 186 of the optical component 18 as shown in FIGS. 2-3, wherein the opaque layer 46 may be formed by a suitable method without particular limitation, e.g. by sputtering. In FIG. 4F, the patterned photoresist layer 441 is removed such that a transparent aperture 488 is formed on each of the individual components 421 so as to form a plurality of optical components 48 at the same time. Finally, after the tape 40 is removed, the optical components 48 are simultaneously attached to the corresponding optical sensor chips on the silicon wafer in the wafer level process, e.g. adhering by glue.

Figure 5:
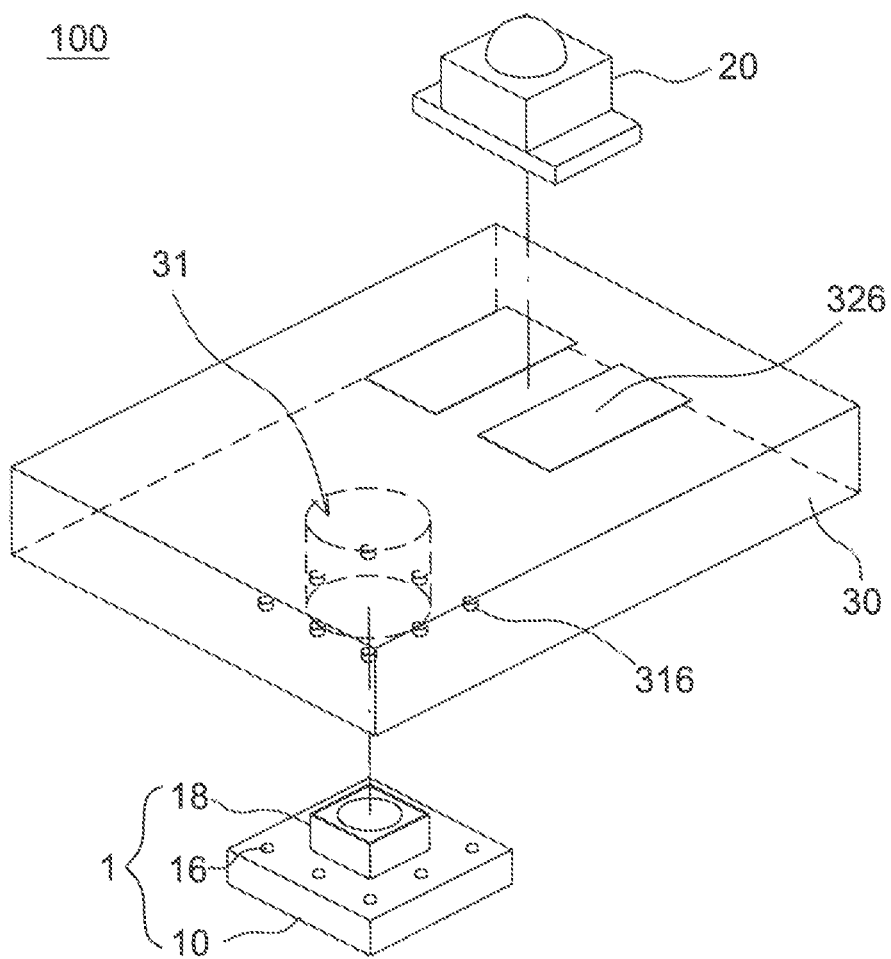
FIG. 5 is an exploded view of an optical sensor assembly according to one embodiment of the present disclosure.
Figure 6:
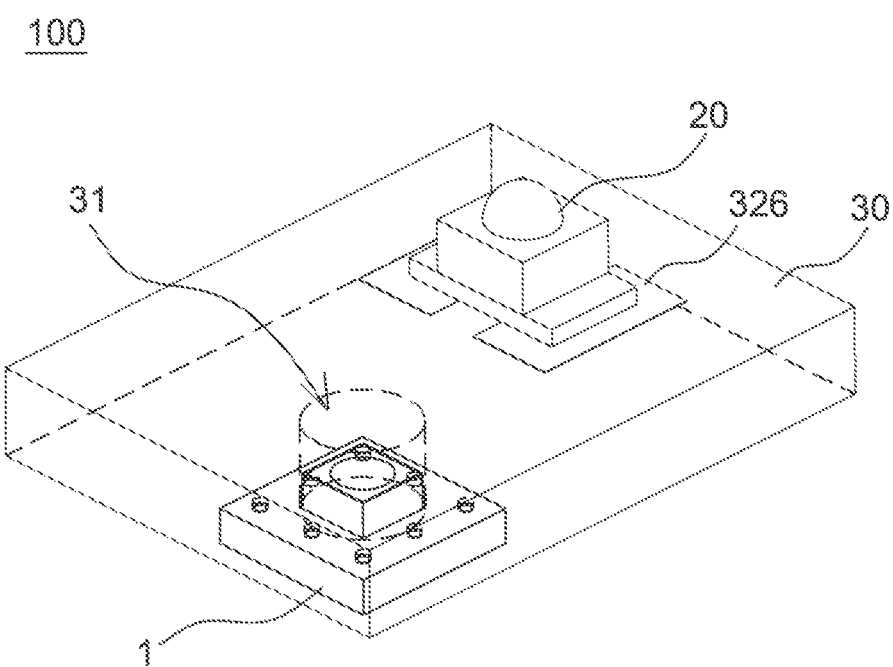
FIG. 6 is a perspective view of an optical sensor assembly according to one embodiment of the present disclosure.

Referring to FIGS. 5 and 6, FIG. 5 is an exploded view of an optical sensor assembly according to one embodiment of the present disclosure, and FIG. 6 is a perspective view of an optical sensor assembly according to one embodiment of the present disclosure. The optical sensor assembly 100 of this embodiment includes an optical sensor package 1, a substrate 30 and a light source 20. The optical sensor package 1 may be, for example, that shown in FIGS. 1-3 including abase layer 10, and a pixel array 12 and a plurality of solder balls 16 are disposed on a first surface 10S of the base layer 10, wherein an optical component 18 is further covered upon the pixel array 12. The optical sensor assembly 100 of this embodiment may be applied to a proximity sensor, a distance sensor, an ambient light sensor, a gesture recognition device or the like, but not limited thereto.

The light source 20 may be a coherent light source, a partially coherent light source or a non-coherent light source without particular limitation, e.g. being a light emitting diode or a laser diode. The light source 20 is configured to emit a target light spectrum to illuminate an external object to allow reflected light from the external object to be received by the optical sensor package 1. The light source 20 itself may have the optical component for adjusting the emission angle.

The substrate 30 may be a printed circuit board (PCB) or a flexible circuit board (FCB), and has a first surface (e.g. the bottom surface herein) and a second surface (e.g. the upper surface herein). The substrate 30 includes an accommodation throughhole 31 and a plurality of contact pads 316. The accommodation throughhole 31 is configured to accommodate the optical component 18 of the optical sensor package 1. The contact pads 316 are disposed at the bottom surface of the substrate 30 and aligned with the solder balls 16 of the optical sensor package 1. Accordingly, when the optical sensor package 1 is combined with the substrate 30 (as shown in FIG. 6), the contact pads 316 are electrically connected to the solder balls 16 of the optical sensor package 1 to be served as a bonding interface between the solder balls 16 and the substrate 30.

In one embodiment, at least one bonding zone 326 is formed on the upper surface of the substrate 30 configured to dispose the light source 20 and electrically connect thereto. In this embodiment, as the optical sensor package 1 is combined with the substrate 30 at the bottom surface of the substrate 30, the optical component 18 of the optical sensor package 1 is accommodated in the accommodation throughhole 31 so as to effectively decrease a total thickness of the optical sensor assembly 100. In addition, according to this structure, the optical sensor package 1 is configured to receive the light from a front direction of the upper surface of the substrate 30 to prevent from receiving the stray light directly from the light source 20.

Figure 7:
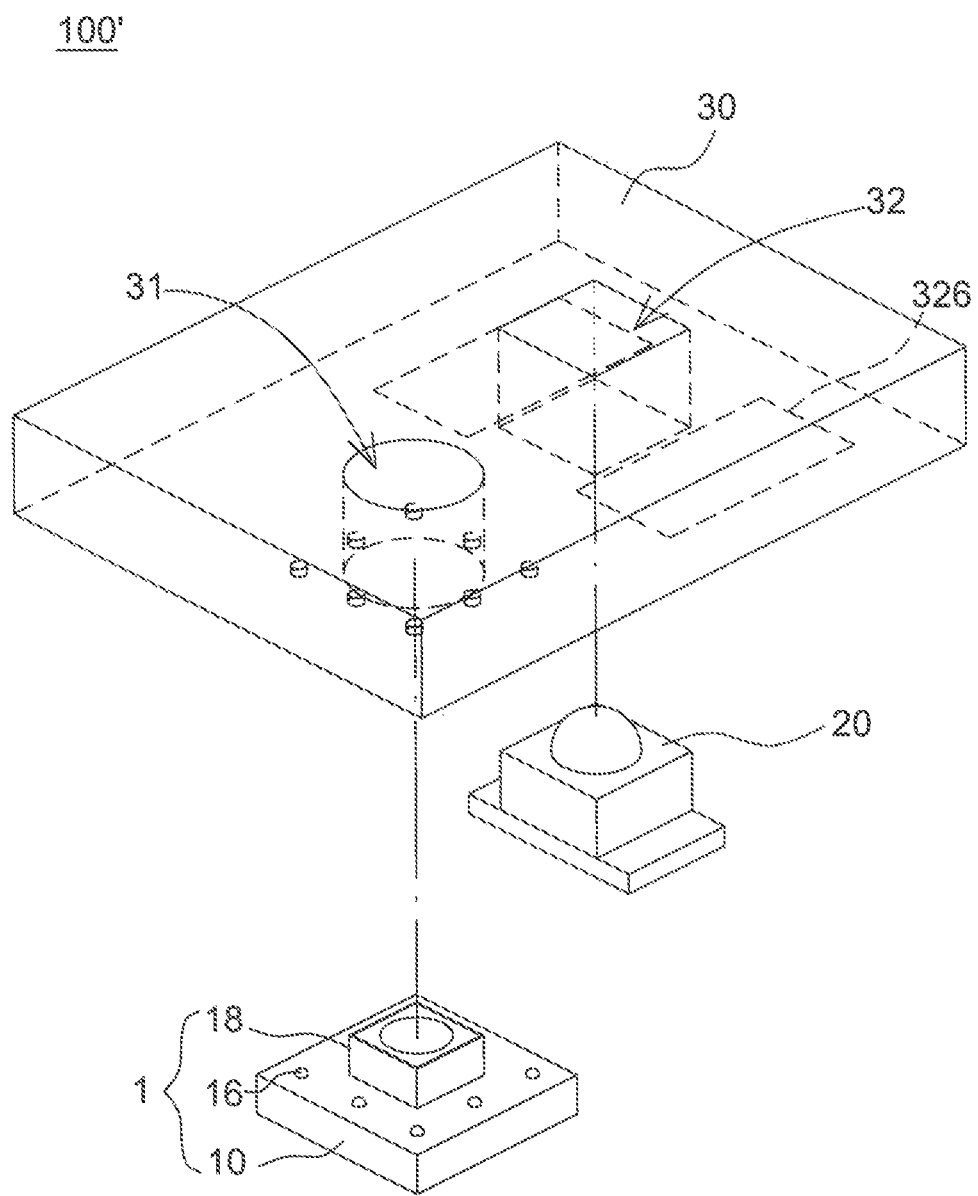
FIG. 7 is a perspective view of an optical sensor assembly according to another embodiment of the present disclosure.

Referring to FIG. 7, it is a perspective view of the optical sensor assembly 100' according to another embodiment of the present disclosure. The difference between FIG. 7 and FIG. 5 is that in FIG. 7, both the optical sensor package 1 and the light source 20 are combined with the bottom surface of the substrate 30. Accordingly, in this embodiment the substrate 30 further includes a light source accommodation throughhole 32, and the bonding zone 326 is formed at the bottom surface of the substrate 30 for disposing the light source 20 and connecting thereto. In this embodiment, as the optical sensor package 1 and the optical component 18 are combined with the bottom surface of the substrate 30, the optical component 18 of the optical sensor package 1 is accommodated in the accommodation throughhole 31 and the light source 20 is accommodated in the light source accommodation throughhole 32 so as to effectively decrease a total height of the optical sensor assembly 100'. In addition, according to this structure the optical sensor package 1 is configured to receive light from a front direction of the upper surface of the substrate 30 and the light source 20 is configured to emit light toward the front direction of the upper surface of the substrate 30 such that the optical sensor package 1 does not receive the stray light directly from the light source 20.

It should be mentioned that the ratio between every element in the drawings herein is only intended to illustrate but not to limit the present disclosure.

As mentioned above, in the conventional image sensor package, as the solder balls and the lens are respectively disposed at two opposite sides of an image sensor chip, the package has a considerable thickness and complicated manufacturing process, e.g. flipping of the chip is necessary in manufacturing. Therefore, the present disclosure further provides an optical sensor package (FIGS. 1-3) and an optical sensor assembly (FIGS. 5-7) that include a photo sensing region and a plurality of solder balls formed on a same surface of a base layer of an optical sensor chip such that when the optical sensor chip is assembled to a substrate, an optical component of the optical sensor chip is accommodated inside an accommodation throughhole of the substrate thereby reducing the total thickness and manufacturing complexity.

Although the disclosure has been explained in relation to its preferred embodiment, it is not used to limit the disclosure. It is to be understood that many other possible modifications and variations can be made by those skilled in the art without departing from the spirit and scope of the disclosure as hereinafter claimed.

What is claimed is:

1. An optical sensor package comprising:
    a base layer comprising a pixel array disposed close to a first surface of the base layer;
    a plurality of solder balls disposed on the first surface of the base layer and outside of the pixel array; and
    an optical component covering on the pixel array and comprising:
        a transparent layer attached to the first surface of the base layer and covering on the pixel array, the transparent layer directly in contact with the first surface of the base layer;
        a filter layer covering on the transparent layer; and
        an opaque layer covering on sides of the transparent layer not being covered by the filter layer and on the filter layer and exposing a part of the filter layer configured as a transparent aperture.

2. The optical sensor package as claimed in claim 1, wherein the solder balls are disposed between the optical component and edges of the first surface.

3. The optical sensor package as claimed in claim 1, further comprising a plurality of bond pads between the first surface of the base layer and the solder balls.

4. The optical sensor package as claimed in claim 1, wherein the optical component is adhered to the first surface of the base layer via glue.

5. The optical sensor package as claimed in claim 1, wherein the transparent layer is a glass layer or a plastic layer.

6. The optical sensor package as claimed in claim 1, wherein the filter layer is an infrared filter layer.

7. The optical sensor package as claimed in claim 1, wherein the base layer further comprises a control circuit therein electrically coupled to the pixel array.

* * * * *